(12) United States Patent
Maejima

(10) Patent No.: US 10,784,275 B1
(45) Date of Patent: Sep. 22, 2020

(54) NONVOLATILE SEMICONDUCTOR STORAGE DEVICE

(71) Applicant: Toshiba Memory Corporation, Tokyo (JP)

(72) Inventor: Hiroshi Maejima, Setagaya Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/551,488

(22) Filed: Aug. 26, 2019

(30) Foreign Application Priority Data

Mar. 12, 2019 (JP) .................................. 2019-045060

(51) Int. Cl.
| | | |
|---|---|---|
| *G11C 16/26* | (2006.01) | |
| *H01L 27/11556* | (2017.01) | |
| *H01L 27/11582* | (2017.01) | |
| *G11C 5/02* | (2006.01) | |
| *G11C 16/04* | (2006.01) | |
| *G11C 5/06* | (2006.01) | |

(52) U.S. Cl.
CPC .......... *H01L 27/11556* (2013.01); *G11C 5/02* (2013.01); *G11C 5/06* (2013.01); *G11C 16/0441* (2013.01); *G11C 16/0466* (2013.01); *G11C 16/26* (2013.01); *H01L 27/11582* (2013.01); *G11C 16/0483* (2013.01)

(58) Field of Classification Search
None
See application file for complete search history.

(56) References Cited

U.S. PATENT DOCUMENTS

2016/0055913 A1* 2/2016 Lee .................... G11C 16/08
365/185.24
2017/0271349 A1 9/2017 Miyagawa et al.

FOREIGN PATENT DOCUMENTS

JP 2017174866 A 9/2017

* cited by examiner

*Primary Examiner* — Tan T. Nguyen
(74) *Attorney, Agent, or Firm* — Kim & Stewart LLP

(57) ABSTRACT

A nonvolatile semiconductor storage device includes a memory cell array layer that includes a plurality of nonvolatile memory cells connected in series in a vertical direction above a semiconductor substrate, a plurality of word lines respectively connected to gates of the plurality of nonvolatile memory cells, a select gate transistor layer that is located above the memory cell array and includes at least first and second select gate transistors connected in series in the vertical direction and to the plurality of nonvolatile memory cells, and at least first and second select gate lines respectively connected to the at least first and second select gate transistors, and a control circuit configured to execute a read operation on the nonvolatile memory cells, such that during a read period of the read operation, signals having different voltage levels are supplied to the at least first and second select gate lines.

20 Claims, 12 Drawing Sheets

NONVOLATILE SEMICONDUCTOR STORAGE DEVICE

CROSS-REFERENCE TO RELATED APPLICATION(S)

This application is based upon and claims the benefit of priority from Japanese Patent Application No. 2019-045060, filed Mar. 12, 2019, the entire contents of which are incorporated herein by reference.

FIELD

Embodiments described herein relate generally to a nonvolatile semiconductor storage device.

BACKGROUND

A NAND flash memory is known as a nonvolatile semiconductor storage device. In order to increase the capacity of a NAND flash memory, a three-dimensional NAND flash memory including a large number of stacked memory cells has been put into practical use.

DETAILED DESCRIPTION

Figure 1:
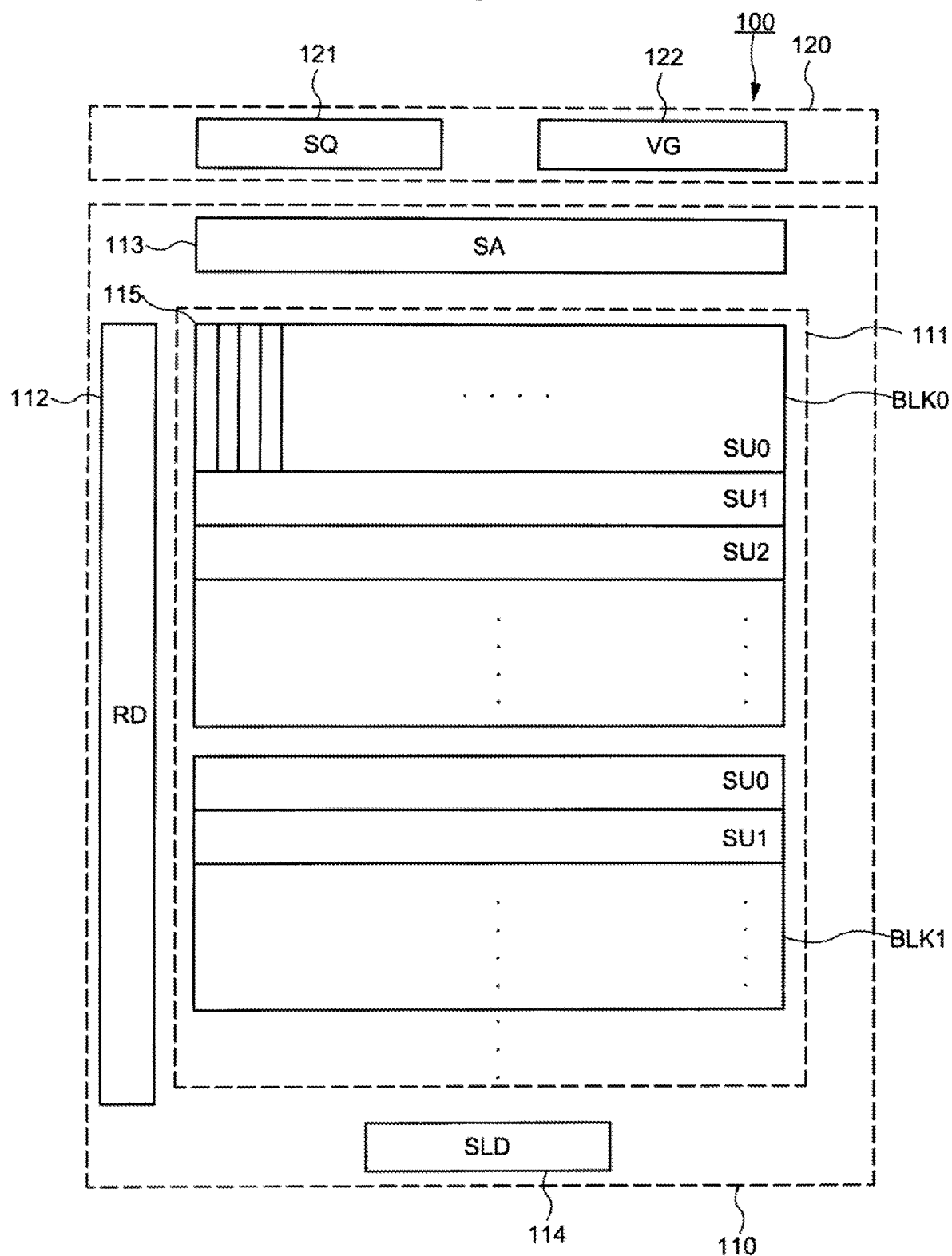
FIG. 1 is a schematic diagram of a nonvolatile semiconductor storage device according to an embodiment.

Embodiments improve the reliability of a three-dimensional NAND flash memory.

In general, according to one embodiment, a nonvolatile semiconductor storage device includes a memory cell array that includes a plurality of nonvolatile memory cells connected in series in a vertical direction above a semiconductor substrate, a plurality of word lines respectively connected to gates of the plurality of nonvolatile memory cells, a select gate transistor layer that is located above the memory cell array and includes at least first and second select gate transistors connected in series in the vertical direction and to the plurality of nonvolatile memory cells, and at least first and second select gate lines respectively connected to the at least first and second select gate transistors, and a control circuit configured to execute a read operation on the nonvolatile memory cells, such that during a read period of the read operation, signals having different voltage levels are supplied to the at least first and second select gate lines.

Hereinafter, a nonvolatile semiconductor storage device according to the present embodiment will be described in detail with reference to the drawings. In the following description, components having substantially the same functions and configurations are denoted by the same reference numerals, and the description thereof will be repeated only when necessary. In addition, the following embodiment illustrates a device or a method for embodying the technical idea of the embodiment, and the technical idea of the embodiment is not limited to the material, shape, structure, arrangement, and the like of the components described below. Various changes may be made to the technical idea of the embodiment within the scope of claims.

[Configuration of the Nonvolatile Semiconductor Storage Device]

First, a configuration of the nonvolatile semiconductor storage device according to the present embodiment is described with reference to FIG. 1.

As shown in FIG. 1, a nonvolatile semiconductor storage device 100 according to the present embodiment generally includes a core unit 110 and a peripheral circuit 120.

The core unit 110 includes a memory cell array 111, a row decoder (RD) 112, a sense amplifier (SA) 113, and a source line driver (SLD) 114.

The memory cell array 111 includes a plurality of blocks BLK (BLK0, BLK1, . . . ) each including a plurality of nonvolatile memory cell transistors. Data in the same block BLK is erased collectively.

Each block BLK includes a plurality of string units SU (SU0, SU1, . . . ). Further, each string unit SU includes a plurality of NAND strings 115. A plurality of memory cell transistors is connected in series in the NAND string 115. The memory cell array 111 includes any number of blocks BLK, string units SU, and NAND strings 115.

At the time of data writing and reading, the row decoder (RD) 112 decodes an address of a block BLK or an address of a page, and selects various control lines such as a target word line. Further, various voltages are supplied to various control lines such as other word lines connected to the NAND strings 115.

During a data read operation, the sense amplifier (SA) 113 senses and amplifies data read from a memory cell transistor to a bit line. Further, during a data write operation, a voltage corresponding to data being written is supplied to the bit line.

The source line driver (SLD) 114 supplies a necessary voltage to a source line during data writing, reading, and erasing.

The peripheral circuit 120 includes a sequencer (SQ) 121 and a voltage generation circuit (VG) 122.

The sequencer (SQ) 121 controls the entire operations of the nonvolatile semiconductor storage device 100.

The voltage generation circuit (VG) 122 generates voltages required for data writing, reading, and erasing, and supplies the generated voltages to the row decoder 112, the sense amplifier 113, and the source line driver 114.

[Circuit Diagram of Block in Memory Cell Array]

Figure 2:
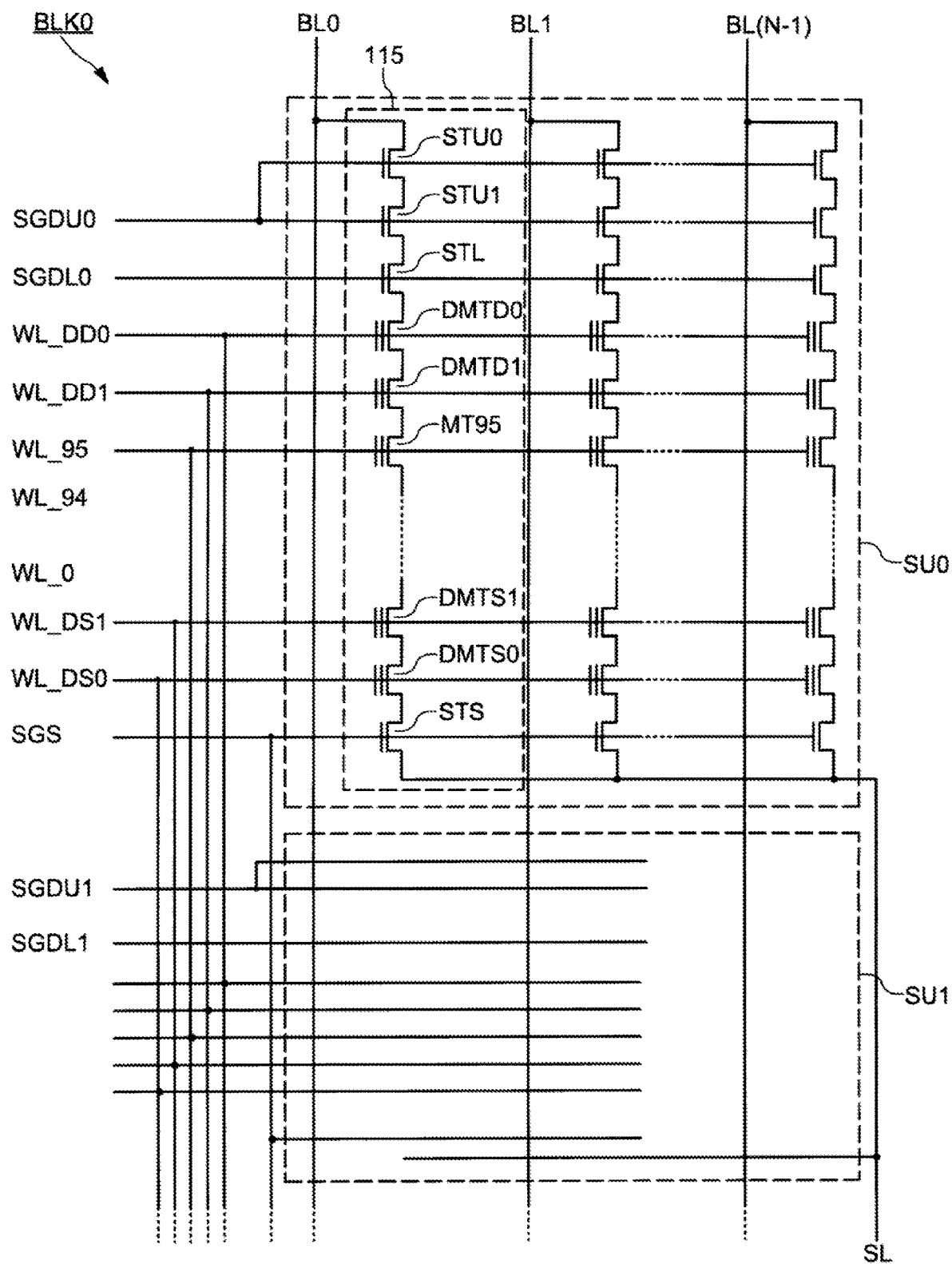
FIG. 2 is a circuit diagram of a block included in a memory cell array layer of the nonvolatile semiconductor storage device according to the embodiment.

FIG. 2 is a circuit diagram of a block BLK in the memory cell array 111 of the nonvolatile semiconductor storage device 100 according to the present embodiment. Although a block BLK0 is described as an example, the remaining blocks BLK1, 2, . . . have the same circuit configuration.

The block BLK0 is connected to N bit lines BL (BL0, BL1, . . . ). In addition, the block BLK0 is connected to the source line SL. The NAND string 115 is connected between the bit line BL and the source line SL. The NAND string 115 is formed by connecting three drain side select gate transistors ST (STU0, STU1, and STL), two drain side dummy cells DMTD (DMTD0 and DMTD1), ninety six memory cells MT (MT95, MT94, . . . , MT0), two source side dummy cells DMTS (DMTS1 and DMTS0), and a source side select gate transistor STS in series.

The drain side select gate transistor STU0 and the drain side select gate transistor STU1 (corresponding to an upper layer select gate transistor to be described later) are both commonly connected to a drain side select gate line SGDU0, and the drain side select gate transistor STL (corresponding to a lower layer select gate transistor to be described later) is connected to a drain side select gate line SGDL0.

The drain side dummy cells DMTD (DMTD0 and DMTD1) are connected to corresponding dummy cell word lines WL_DD (WL_DD0 and WL_DD1) respectively. The ninety six memory cells MT (MT95, MT94, . . . , MT0) are connected to corresponding word lines WL (WL_95, WL_94, . . . WL_0) respectively. The source side dummy cells DMTS (DMTS1 and DMTS0) are connected to corresponding dummy cell word lines WL_DS (WL_DS1 and WL_DS0) respectively.

The source side select gate transistor STS is connected to a source side select gate line SGS.

[Circuit Diagram of Drive Circuit in Row Decoder]

Figure 3:
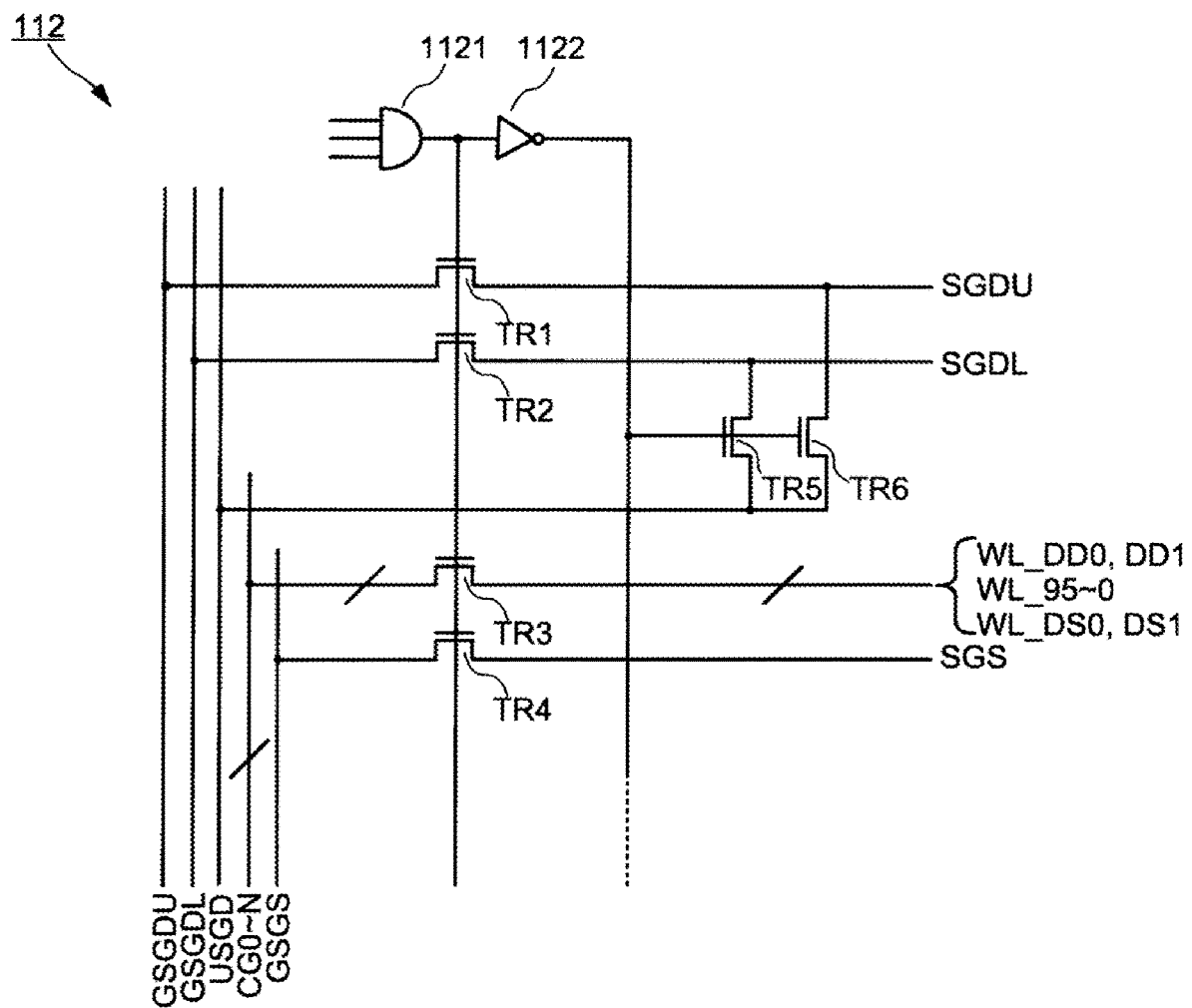
FIG. 3 is a circuit diagram of a drive circuit included in a row decoder of the nonvolatile semiconductor storage device according to the embodiment.

FIG. 3 is a circuit diagram of a drive circuit in the row decoder 112 of the nonvolatile semiconductor storage device 100 according to the present embodiment.

The row decoder 112 includes a block select decoder circuit 1121 configured to select a block BLK in response to an address signal, an inverter circuit 1122, a transistor TR1, a transistor TR2, one hundred transistors TR3, a transistor TR4, a transistor TR5, and a transistor TR6.

The transistor TR1 is connected between a global select gate line GSGDU and a drain side select gate line SGDU, and is controlled by an output of the block select decoder circuit 1121. The transistor TR2 is connected between a global select gate line GSGDL and a drain side select gate line SGDL, and is controlled by an output of the block select decoder circuit 1121. The drain side select gate lines SGDU and SGDL are respectively connected to one end of the transistor TR6 and one end of the transistor TR5, and the other end of the transistor TR6 and the other end of the transistor TR5 are connected to a non-select block voltage supply line USGD.

The transistors TR3 are respectively connected between corresponding control signal lines CG0 to CGN and the dummy cell word lines WL_DD (WL_DD0 and WL_DD1), the dummy cell word lines WL_DS (WL_DS0 and WS_DS1), and the word lines WL (WL_95 to WL_0), and are controlled by an output of the block select decoder circuit 1121.

The transistor TR4 is connected between a global select gate line GSGS and a source side select gate line SGS, and is controlled by an output of the block select decoder circuit 1121.

[Plan View and Cross-Sectional View of Memory Cell Array]

Figure 4A:
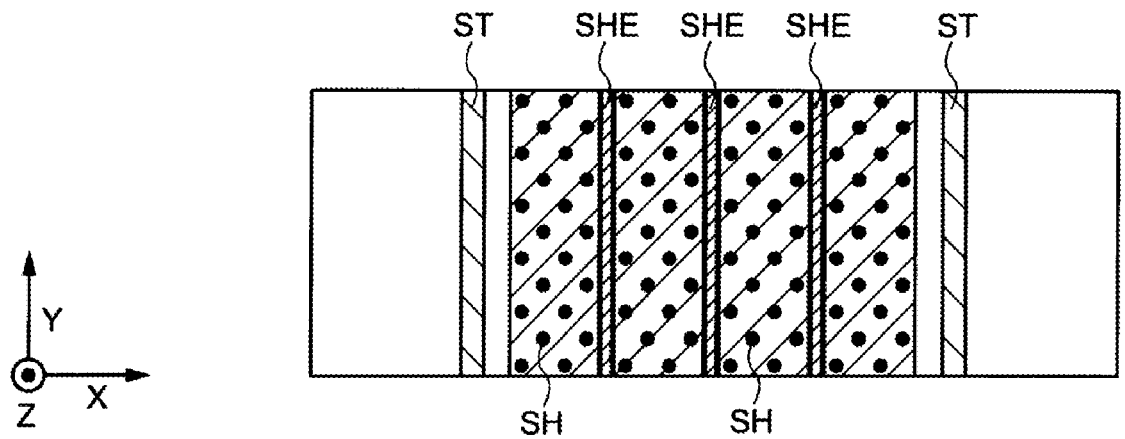
FIG. 4A is a plan view of an SGD layer of a memory cell array.
Figure 4B:
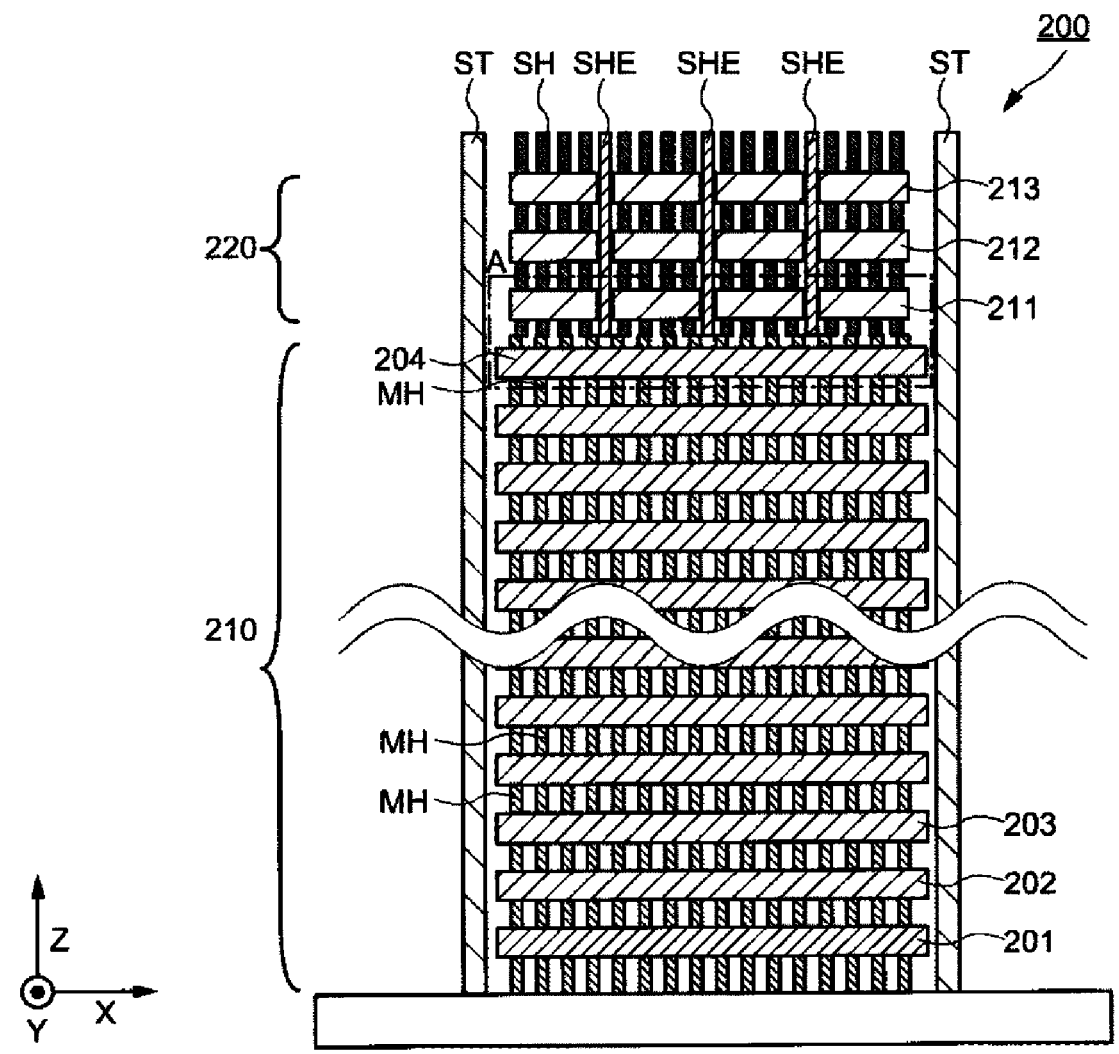
FIG. 4B is a cross-sectional view of the memory cell array of the nonvolatile semiconductor storage device according to the embodiment.

FIG. 4A is a plan view of an SGD layer of a stacked body 200 that forms the memory cell array 111 of the nonvolatile semiconductor storage device 100 according to the present embodiment. FIG. 4B is a cross-sectional view of the stacked body 200.

In the stacked body 200 of the memory cell array 111 of the nonvolatile semiconductor storage device 100 according to the present embodiment, a memory cell array layer 210 and an SGD (a drain side select gate) layer 220 are stacked from the bottom via an insulating film on a semiconductor substrate (not shown).

In the memory cell array layer 210, a large number of through holes (referred to herein as memory holes MH) are formed through a stacked body which includes a large number of alternately stacked conductive films 201, 202, 203, . . . , 204. An insulating film (e.g., a $SiO_2$ film or a SiN film), a charge storage film (e.g., a SiON film), and a gate oxide film (e.g., a $SiO_2$ film) are stacked one each semiconductor film (e.g., a polysilicon film) disposed in the memory holes MH. The conductive film 201 located in a lower layer of the memory cell array layer corresponds to a gate of the source side select transistor STS. The conductive films 202, 203, . . . , 204 located in the middle layers and upper layers of the memory cell array layer correspond to gates of the memory cells MT and dummy cells DMT.

In the SGD layer 220, a large number of through holes (hereinafter referred to as select transistor holes SH) are formed through a stacked body which includes three alternately stacked conductive films 211, 212, and 213 and insulating films. Similarly to the memory holes MH, an insulating film (e.g., a $SiO_2$ film or a SiN film), a charge storage film (e.g., a SiON film), and a gate oxide film (e.g., a $SiO_2$ film) are stacked on each semiconductor film (e.g., a polysilicon film) disposed in the select transistor holes SH. The conductive film 211 located in a lower layer of the SGD layer 220 corresponds to a gate of the drain side select gate transistor STL. The conductive film 212 located in a middle layer of the SGD layer 220 corresponds to a gate of the drain side select gate transistor STU1. The conductive film 213 located in an upper layer of the SGD layer 220 corresponds to a gate of the drain side select gate transistor STU0.

The stacked body 200 is electrically separated from an adjacent stacked body 200 by a memory slit ST that vertically passes between the two stacked bodies. A memory slit ST is filled with a conductor to form a source line contact that vertically passes between the two stacked bodies. The source line contact forms a part of the source line SL.

Figure 5A:
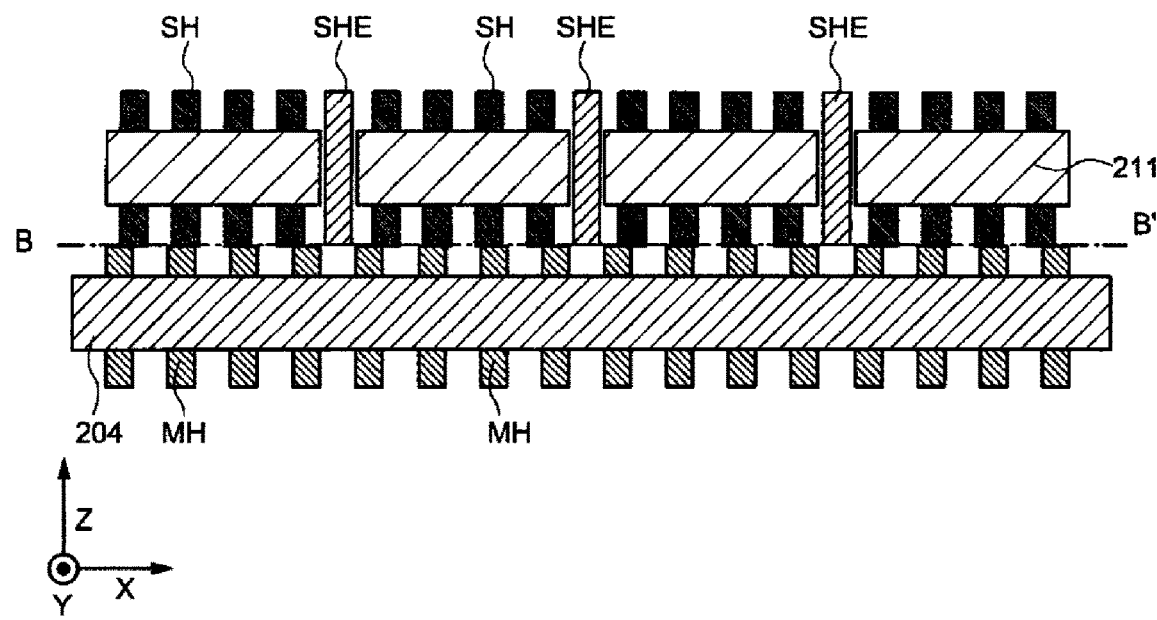
FIGS. 5A and 5B are an enlarged cross-sectional view and an enlarged plan view of a coupling portion between the memory cell array layer and the SGD layer of the nonvolatile semiconductor storage device according to the embodiment.
Figure 5B:
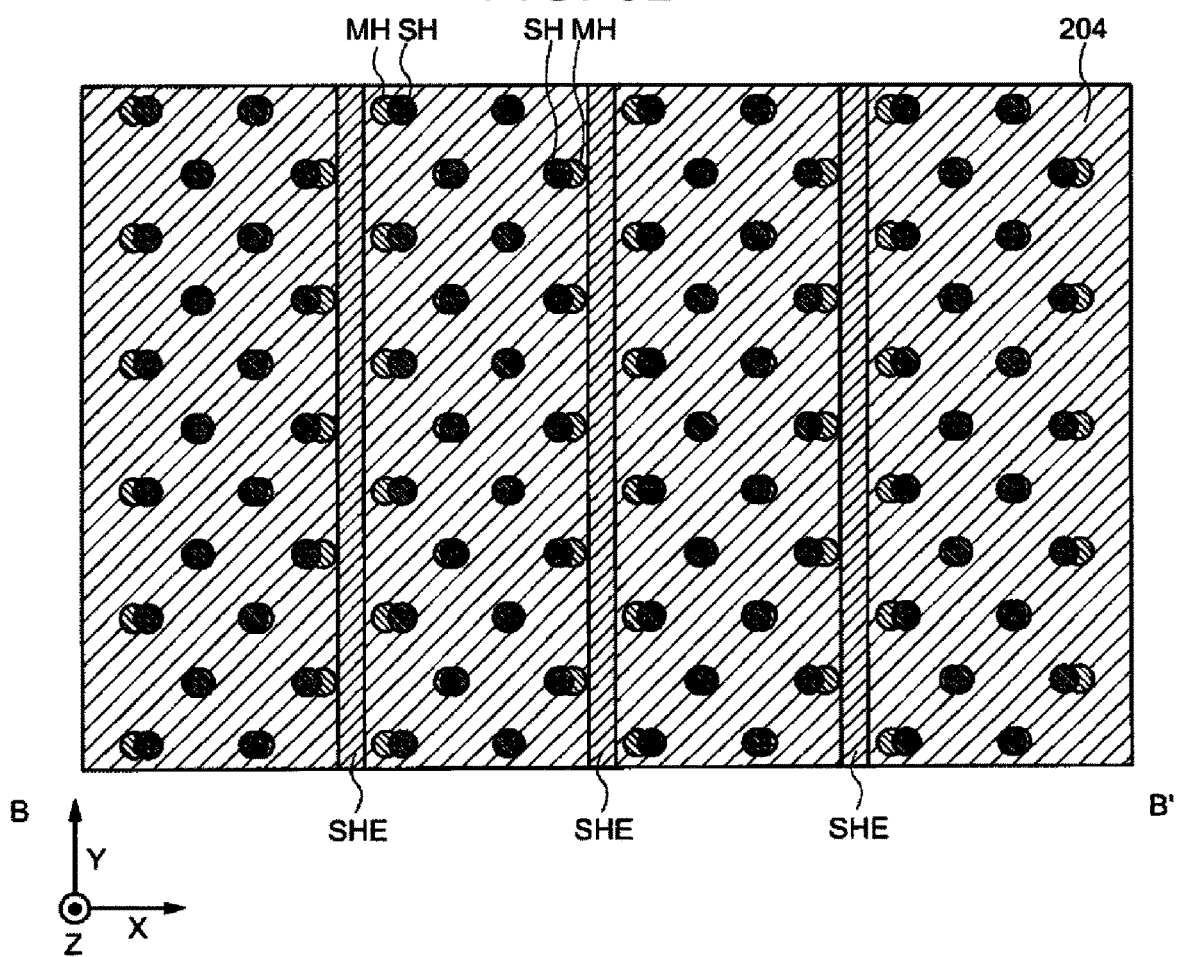

FIG. 5A is an enlarged cross-sectional view of a coupling portion (a portion represented by a dotted line A in FIG. 4B) between the memory cell array layer 210 and the SGD layer 220 of the nonvolatile semiconductor storage device according to the present embodiment. FIG. 5B is an enlarged plane view of a coupling boundary surface (a surface represented by a dotted line B-B' in FIG. 5A) between the memory cell array layer 210 and the SGD layer 220.

As shown in FIG. 5A, the conductive film 211 is, for example, cut into four pieces in an X direction. Therefore, the size of each conductive film 211 (corresponding to a gate of the drain side select gate transistor STL) in the X direction is smaller than ¼ of the size of the conductive film 204 (corresponding to a gate of the dummy cell DMTD0) in the X direction. Insulating shields SHE are formed between individual conductive films 211.

The insulating shield SHE is not provided on the memory cell array layer 210 but only on the SGD layer 220. Therefore, it is necessary to make a pitch of the select transistor holes SH formed on the SGD layer 220 smaller than a pitch of the memory holes MH formed on the memory cell array layer 210. In other words, it is necessary to make the arrangement density of the select transistor holes SH formed on the SGD layer 220 higher than the arrangement density of the memory holes MH formed on the memory cell array layer 210. Therefore, it is necessary to physically shift the select transistor holes SH formed on the SGD layer 220 with respect to the memory holes MH formed on the memory cell array layer 210. As a result, the select transistor holes SH and the memory holes MH may become misaligned on a connection surface. The misalignment is apparent on a side closest to the insulating shield SHE. FIG. 5B conceptually shows the misalignment on the connection surface between the select transistor holes SH and the memory holes MH.

Figure 6:
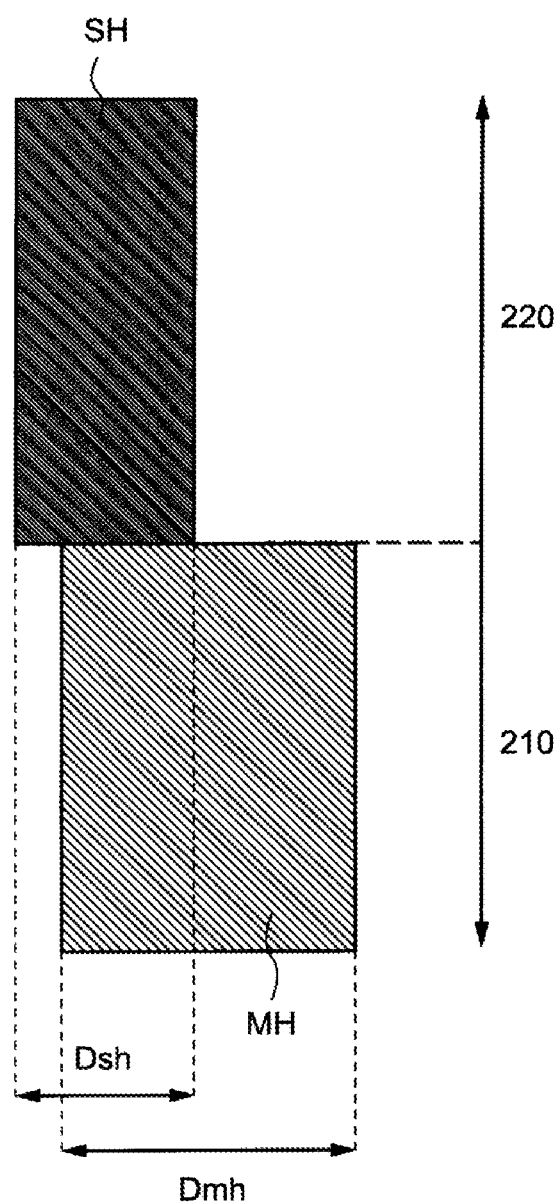
FIGS. 6-7 are each a conceptual diagram of the coupling portion between the memory cell array layer and the SGD layer of the nonvolatile semiconductor storage device according to the embodiment.
Figure 7:
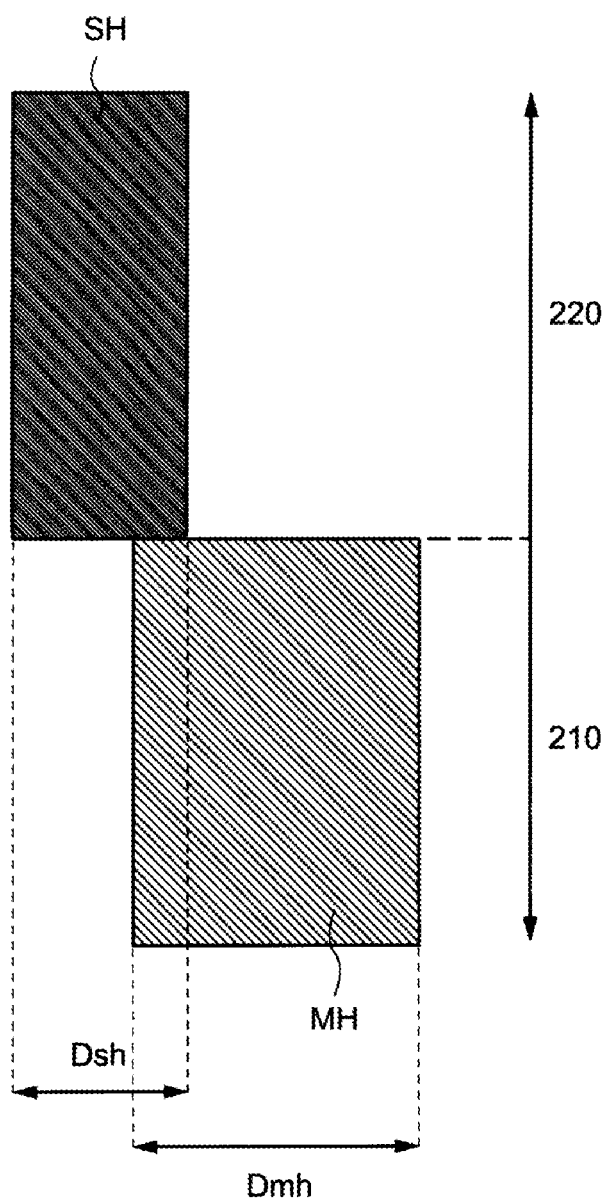

FIG. 6 is a conceptual diagram of the coupling portion between the memory cell array layer 210 and the SGD layer 220 when a shift amount is relatively small. FIG. 7 is a conceptual diagram of the coupling portion between the memory cell array layer 210 and the SGD layer 220 when the shift amount is larger than that in FIG. 6. From here, since a current path is limited when the shift amount is equal to or larger than a predetermined value, it can be understood that connection resistance (ON resistance) is increased, and thus a cell current (Icell) flowing in a cell array is decreased.

FIG. 5A and FIG. 5B show that a diameter of the select transistor hole SH formed on the SGD layer 220 is substantially the same as a diameter of the memory hole MH formed on the memory cell array layer 210. However, the embodiment is not limited thereto and the diameter (Dsh) of the select transistor hole SH may be different from the diameter (Dmh) of the memory hole MH. Since the arrangement density of the select transistor holes SH is required to be higher than that of the memory holes MH, the diameter Dsh of the select transistor hole SH is preferably smaller than the diameter Dmh of the memory hole MH, as shown in FIG. 6 and FIG. 7, for example. Since the diameter Dsh of the select transistor hole SH is smaller, the arrangement density of the select transistor holes SH is increased. In addition, when the dimension of the misalignment is the same, since the diameter Dsh of the select transistor hole SH is smaller than the diameter Dmh of the memory hole MH, an area where the diameter Dsh of the select transistor hole SH does not overlap with the diameter Dmh of the memory hole MH can be reduced compared to a case where the diameter Dsh of the select transistor hole SH is the same as the diameter Dmh of the memory hole MH.

[First Example of Signals Supplied to Select Transistors]

Figure 8:
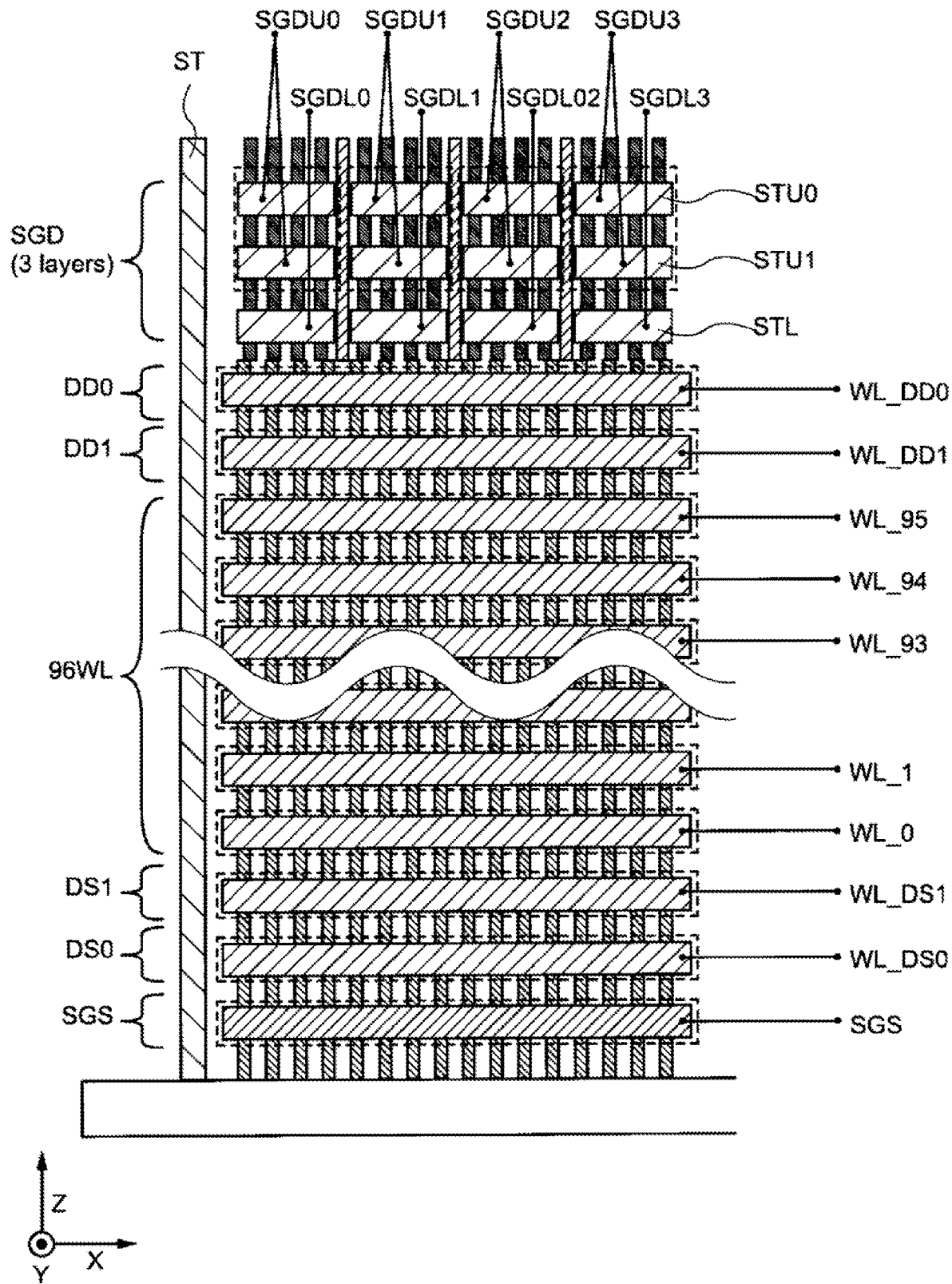
FIG. 8 is a diagram showing one example of signals supplied to a select transistor of the nonvolatile semiconductor storage device according to the embodiment.

FIG. 8 is a diagram illustrating signals supplied to the select transistors STU0, STU1 and STL of the nonvolatile semiconductor storage device 100 according to the present embodiment.

As shown in FIG. 8, signals SGDU0, SGDU1, SGDU2, and SGDU3 are individually supplied to the drain side select gate transistors STU0 and STU1. Further, signals SGDL0, SGDL1, SGDL2, and SGDL3 are individually supplied to the drain side select gate transistor STL. Then, at a timing when a sense amplifier detects a bit line current during a read operation (or a verification operation), voltages of one level are supplied to SGDU0, SGDU1, SGDU2, and SGDU3 and voltages of different level are supplied to SGDL0, SGDL1, SGDL2, and SGDL3. Further, during a write operation, a medium voltage is applied to a non-selected word line and a high voltage is applied to a selected word line, and at a timing when a channel area (a portion where polysilicon is filled in the memory holes MH) is boosted, voltages of one level are supplied to SGDU0, SGDU1, SGDU2, and SGDU3 voltages of another level are supplied to SGDL0, SGDL1, SGDL2, and SGDL3. The voltages of different levels are supplied by a voltage generation circuit via the above-mentioned drive circuit (FIG. 3).

[Second Example of Signals Supplied to Select Transistors]

Figure 9:
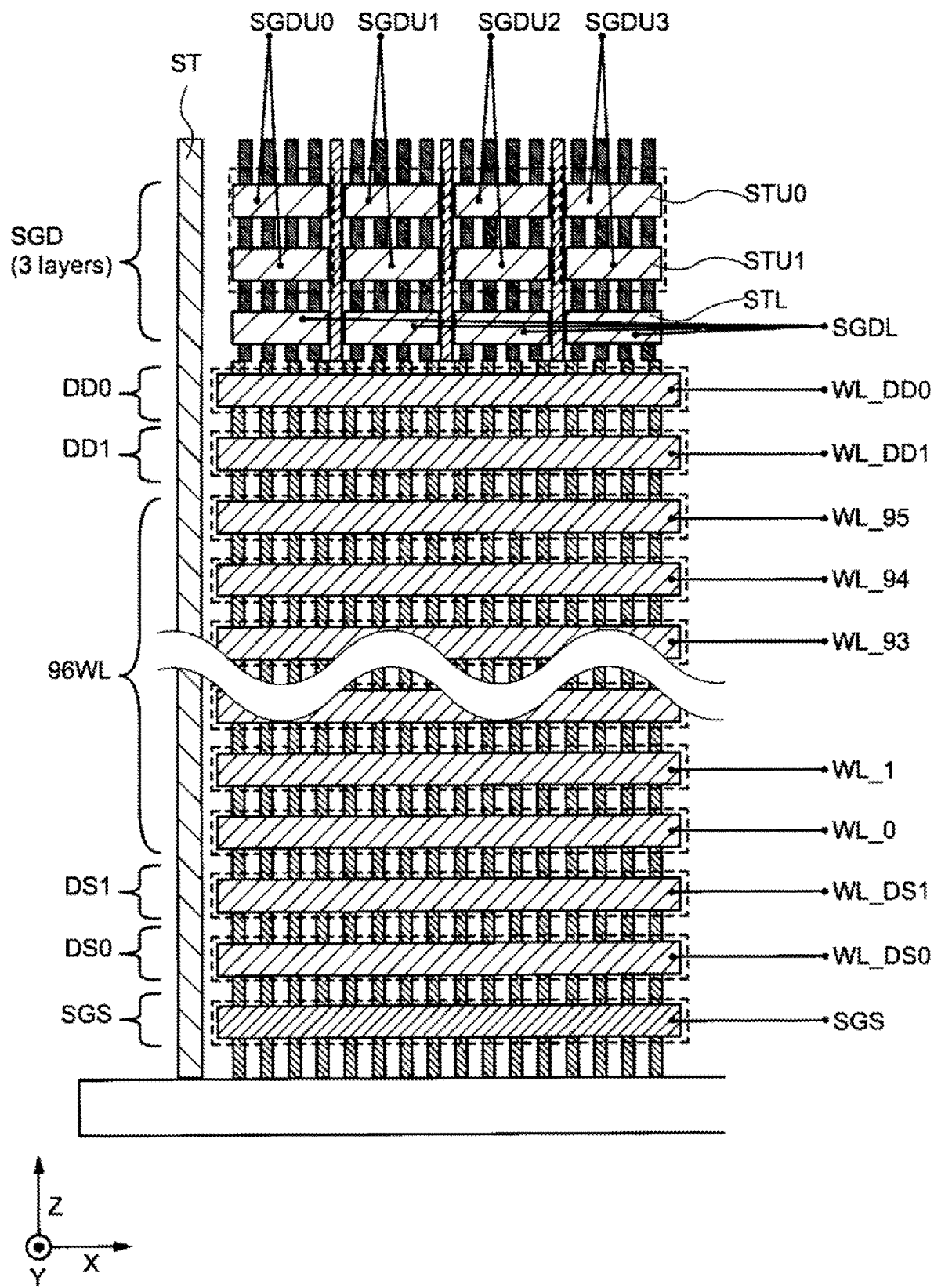
FIG. 9 is a diagram showing another example of signals supplied to the select transistor of the nonvolatile semiconductor storage device according to the embodiment.

FIG. 9 is a diagram showing another example of signals supplied to the select transistors STU0, STU1, and STL of the nonvolatile semiconductor storage device 100 according to the present embodiment.

As shown in FIG. 9, signals SGDU0, SGDU1, SGDU2, and SGDU3 are individually supplied to the drain side select gate transistors STU0 and STU1. In addition, a common signal SGDL is supplied to the drain side select gate transistor STL. Thus, voltages of one level are supplied to SGDU0, SGDU1, SGDU2, and SGDU3 and a voltage of a different level is supplied to SGDL during the read operation (or the verification operation) and the write operation. The voltages of different levels are supplied by the voltage generation circuit via the above-mentioned drive circuit (FIG. 3).

[Description on Operation Waveform (Read Operation)]

Figure 10:
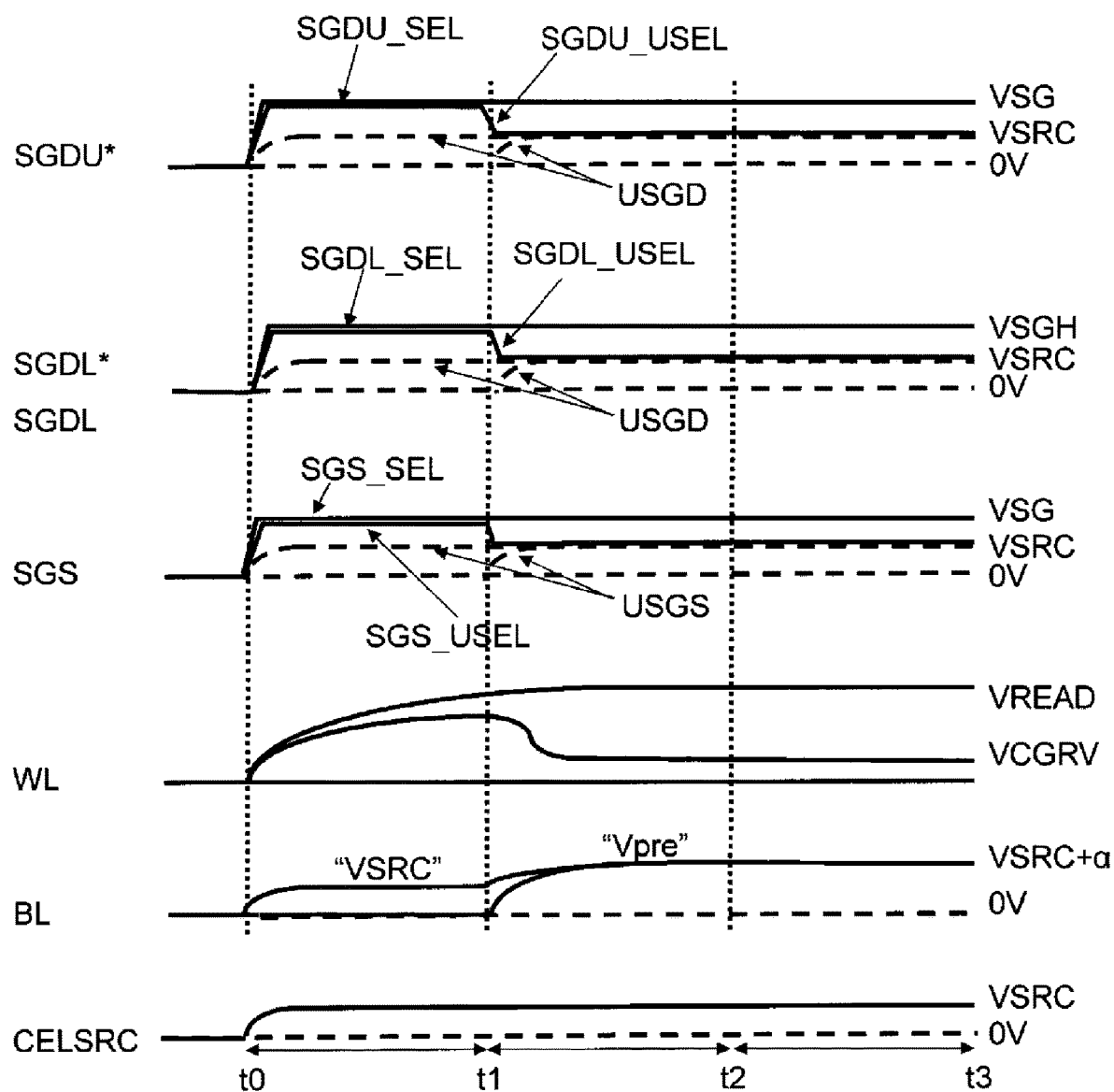
FIG. 10 is a diagram showing voltages supplied to various signal lines during a read operation or a verification operation in the nonvolatile semiconductor storage device according to the embodiment.

FIG. 10 is a diagram showing voltages supplied to various signal lines during the read operation (or the verification operation) in the nonvolatile semiconductor storage device according to the present embodiment.

The read operation includes three stages t0 to t1, t1 to t2, and t2 to t3, in which t0 to t1 is a preparation period for reducing a boosted channel voltage, t1 to t2 is a pre-charge period, and t2 to t3 is a read period for determining data of the memory cell.

As described above, the signals SGDU0, SGDU1, SGDU2, and SGDU3 are supplied to the drain side select gate transistors STU0 and STU1.

A signal supplied to the drain side select gate transistors STU0 and STU1 of a selected string unit of a selected block BLK is referred to as SGDU_SEL. A signal supplied to the drain side select gate transistors STU0 and STU1 of a non-selected string unit of a selected block BLK is referred to as SGDU_USEL.

A signal supplied to the drain side select gate transistor STL of a selected string unit of a selected block BLK is referred to as SGDL_SEL.

A signal supplied to the drain side select gate transistor STL of a non-selected string unit of a selected block BLK is referred to as SGDL_USEL.

A signal supplied to the source side select gate transistor STS of a selected string unit of a selected block BLK is referred to as SGS_SEL.

A signal supplied to the source side select gate transistor STS of a non-selected string unit of a selected block BLK is referred to as SGS_USEL.

A voltage supplied to the drain side select gate transistors STU0, STU1, and STL as well as the source side select gate transistor STS of a string unit of a non-selected block BLK is referred to as USGD.

At time t0, SGDU_SEL and SGDU_USEL of a selected block BLK are raised to VSG (about 6 V). At the same time, SGDL_SEL and SGDL_USEL of a selected block BLK are raised to VSGH (about 6 V+α V). Here, VSGH is higher than VSG by α V (about 0.5 V to 1.5 V). The USGD of a string unit of a non-selected block BLK is kept at 0 V or VSRC (about 3 V, a voltage greater than 0 V and less than VSG).

After time t0, SGS_SEL and SGS_USEL of a selected block BLK are raised to VSG (about 6 V). At the same time, USGS applied to a gate of the source side select gate transistor STS of a string unit of a non-selected block BLK is kept at 0 V or VSRC.

After time t0, a word line WL is raised to a read voltage VREAD. Here, VREAD is a voltage applied to the word line WL connected to a non-selected memory cell among the memory cells that form the string unit. A voltage of CELSRC supplied to a source line SL is raised to VSRC and at the same time a voltage of a bit line BL is also raised to VSRC.

After time t1, SGDU_USEL is dropped down to VSRC while SGDU_SEL is kept at VSG. At the same time, SGDL_USEL is dropped down to VSRC while SGDL_SEL is kept at VSGH. At the same time, SGS_USEL is dropped down to VSRC while SGS_SEL is kept at VSG.

After time t1, a voltage of a selected word line WL is dropped down to VCGRV. At the same time, a voltage of a bit line BL is raised to a pre-charge voltage Vpre.

After time t2, the read operation is performed by the sense amplifier 113. A voltage of the bit line varies depending on a cell current flowing at this time (not shown).

In the read operation after time t2, a voltage of VSG (about 6 V) is applied to the gates of the drain side select gate transistors STU0 and STU1 in upper layers, and a voltage of VSGH (about 7 V) is applied to the gate of the drain side select gate transistor STL in the lower layer. As a result, it is possible to significantly improve ON resistance of a current path that passes through the drain side select gate transistor STL in the lower layer in the vicinity of the surface shown in FIG. 5B. Since a low voltage is supplied to the gates of the drain side select gate transistors in the upper layers, the influence of disturbance caused by a non-selected string unit can be eliminated.

[Description on Operation Waveform (Write Operation)]

Figure 11:
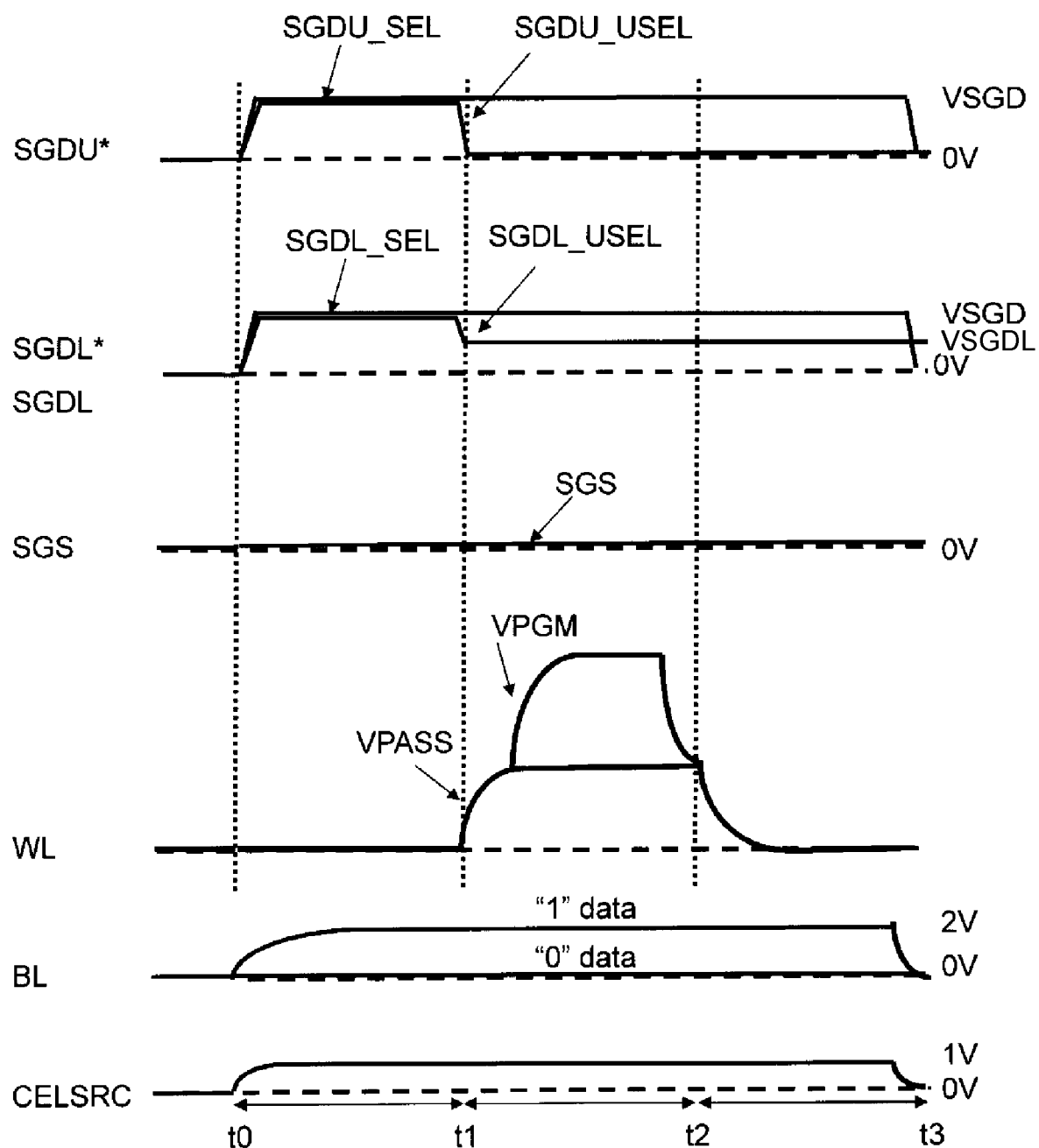
FIG. 11 is a diagram showing voltages supplied to various signal lines during a write operation in the nonvolatile semiconductor storage device according to the embodiment.

FIG. 11 is a diagram showing voltages supplied to various signal lines during a write operation in the nonvolatile semiconductor storage device according to the present embodiment.

The write operation includes three stages t0 to t1, t1 to t2, and t2 to t3, in which t0 to t1 is a write preparation period for stabilizing a boosted channel voltage, t1 to t2 is a write period in which a high voltage is applied, and t2 to t3 is a recovery period in which the high voltage in each node is drawn to the node of 0V.

As described above, a signal supplied to the drain side select gate transistors STU0 and STU1 of a selected string unit of a selected block BLK is referred to as SGDU_SEL, and a signal supplied to the drain side select gate transistors STU0 and STU1 of a non-selected string unit of a selected block BLK is referred to as SGDU_USEL.

As described above, a signal supplied to the drain side select gate transistor STL of a selected string unit of a selected block BLK is referred to SGDL_SEL, and a signal supplied to the drain side select gate transistor STL of a non-selected string unit of a selected block BLK is referred to as SGDL_USEL.

A signal supplied to the source side select gate transistor STS is referred to as SGS.

At time t0, SGDU_SEL, SGDU_USEL, SGDL_SEL, and SGDL_USEL are raised to VSG. SGS is 0 V, and WL is also 0 V.

After time t0, a voltage of a bit line BL is set to a write inhibited voltage ("1" data, data for inhibiting the increase in a threshold voltage) and a write voltage ("0" data, data for allowing the increase in the threshold voltage) corresponding to data. The voltage of CELSRC supplied to a source line SL is raised to about 1 V.

After time t1, SGDU_USEL is dropped down to 0 V while SGDU_SEL is kept at VSGD. At the same time, SGDL_USEL is dropped down to VSGDL (about 2 V, a voltage greater than 0 and lower than VSGD) while SGDL_SEL is kept at VSGD. SGS is kept at 0 V.

After time t1, voltages of all word lines WL are raised to VPASS (about 9 V) and then a voltage of a selected word line WL connected to a memory cell in which the write operation executed is further raised to VPGM (about 18 V). Here, the write operation is executed, and a threshold voltage of a selected memory cell increases according to write data.

After time t2, the voltage of the word lines WL is returned to 0 V and a high voltage is discharged.

In time t1 to t2, a channel area of a selected string unit is raised to a potential close to a pass voltage VPASS by coupling the pass voltage VPASS applied to the word lines WL and a write voltage VPGM. This is the same in a non-selected string unit and this high potential may cause a risk of generating a write disturbance. However, a voltage of VSGDL (about 2 V) is applied to the gate of the drain side select gate transistor STL in the lowermost layer of a non-selected string unit. As a result, the influence of the write data can be reduced. On the other hand, a low voltage (0 V) is supplied to the gate of the drain side select gate transistor in the upper layer and cutoff is reliably performed, so that an influence of the write disturbance can also be eliminated.

[Threshold Voltage Setting]

Figure 12:
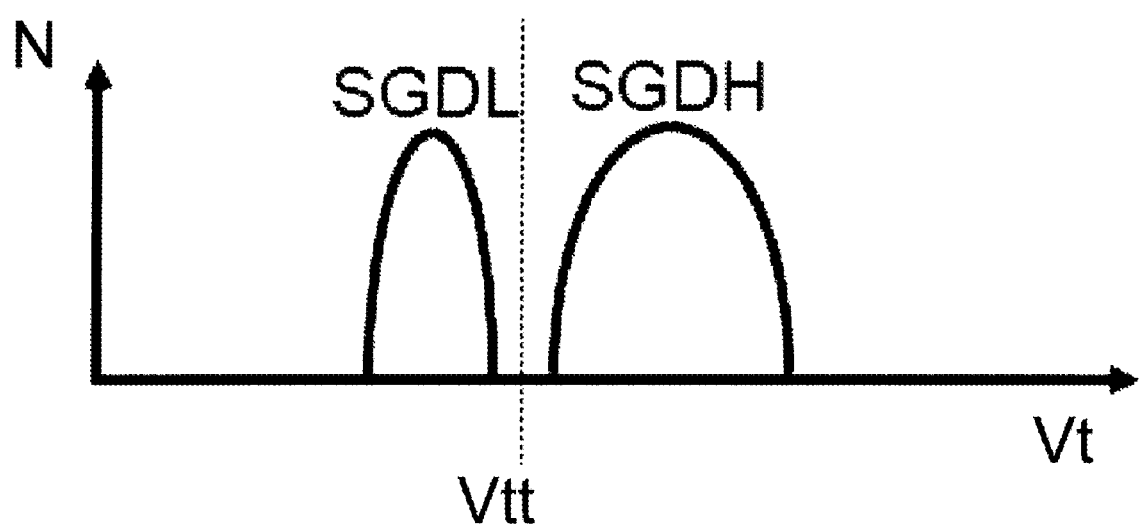
FIG. 12 is a diagram showing distributions of threshold voltages of drain side select transistors in the nonvolatile semiconductor storage device according to the embodiment.

It is preferable that threshold voltages of the drain side select gate transistors STL and STU are different in the nonvolatile semiconductor storage device according to the present embodiment described above. FIG. 12 is a diagram showing distributions of threshold voltages of drain side select transistors in the nonvolatile semiconductor storage device according to the present embodiment.

Specifically, FIG. 12 shows a threshold voltage distribution SGDH of the drain side select gate transistors STU0 and STU1 in the upper layers and a threshold voltage distribution SGDL of the drain side select gate transistor STL in the lowermost layer. Although FIG. 12 shows an example in which the distribution SGDH is distributed above a boundary voltage Vtt with a sufficient margin and the distribution SGDL is distributed below the boundary voltage Vtt with a sufficient margin, smaller margins may be allowed, so long as a lower end of the distribution SGDH is higher than a higher end of the distribution SGDL.

Before the nonvolatile semiconductor storage device according to the present embodiment executes the write operation, the threshold voltage of the drain side select gate transistor is set individually. This is executed according to the same sequence as a normal write operation. Firstly, the threshold voltage of the drain side select gate transistor STL in the lowermost layer is adjusted, and then, the threshold voltages of the drain side select gate transistors STU0 and STU1 in the upper layers are adjusted. Since a channel boost operation can be used in the threshold voltage adjustment of the drain side select gate transistor STL in the lowermost layer, the threshold voltage distribution can be limited to a narrower range.

When the threshold voltages of the drain side select gate transistors STL and STU are different, the following effects are obtained. First, since the diameter of the select gate transistor hole SH is smaller than that of the memory hole MH in many cases, a read disturbance is likely to occur. However, by setting the threshold voltage of the drain side select gate transistor in the lowermost layer to a lower value, even if disturbances occur and the threshold voltage varies (varies in a direction of increase), the influence thereof can be restricted. Further, since the threshold voltages of the drain side select gate transistors in the upper layers are high during the write operation, a cutoff characteristic during the write operation is improved and the leakage due to channel boost is reduced.

As described above, a cell current may be increased and reliability can be improved by individually controlling a gate voltage and a threshold voltage of a plurality of drain side select gate transistors in the same string unit.

MODIFICATION

Although the number of drain side select gate transistors that are connected in series is three in the nonvolatile semiconductor storage device according to the above embodiment, the number may be two, or four or more. In addition, the number of dummy cells and the number of memory cells can be changed as appropriate. Although the number of divisions (k) of string unit in a block is four in the embodiment, the number of divisions of the string unit may be, for example, two, or eight, or any number.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, in the above-described operations, a sufficiently-low voltage may be supplied instead of 0 V.

What is claimed is:

1. A nonvolatile semiconductor storage device, comprising:
   a memory cell array that includes a plurality of nonvolatile memory cells connected in series in a vertical direction above a semiconductor substrate, and a plurality of word lines respectively connected to gates of the plurality of nonvolatile memory cells;
   a select gate transistor layer that is located above the memory cell array and includes at least first and second select gate transistors connected in series in the vertical direction and to the plurality of nonvolatile memory cells, and at least first and second select gate lines respectively connected to the at least first and second select gate transistors; and
   a control circuit configured to execute a read operation on the nonvolatile memory cells, such that during a read period of the read operation, signals having different voltage levels are supplied to the at least first and second select gate lines.

2. The nonvolatile semiconductor storage device according to claim 1, wherein
   the first select gate transistor is above the second select gate transistor, and
   during the read period of the read operation, the voltage level of the signal supplied to the first select gate transistor is lower than the voltage level of the signal supplied to the second select gate transistor.

3. The nonvolatile semiconductor storage device according to claim 2, wherein
   the control circuit is further configured to execute a write operation on the nonvolatile memory cells,
   during the write operation, independent signals are supplied to the first and second select gate lines.

4. The nonvolatile semiconductor storage device according to claim 3, wherein the threshold voltage of the first and second select gate transistors differ.

5. The nonvolatile semiconductor storage device according to claim 3, wherein the threshold voltage of the first select gate transistor is higher than the threshold voltage of the second select gate transistor.

6. The nonvolatile semiconductor storage device according to claim 1, wherein
   the plurality of nonvolatile memory cells are formed around a memory hole that extends vertically above the semiconductor substrate and the at least two select gate transistors are formed around a select gate transistor hole that extends vertically above the memory cell array, and
   the memory hole and the select gate transistor hole are not aligned in the vertical direction.

7. The nonvolatile semiconductor storage device according to claim 6, wherein
   a diameter of the memory hole is different from a diameter of the select gate transistor hole.

8. The nonvolatile semiconductor storage device according to claim 7, wherein the diameter of the memory hole is greater than the diameter of the select gate transistor hole.

9. The nonvolatile semiconductor storage device according to claim 8, wherein the select gate transistor layer is divided into k pieces in a horizontal direction with an insulating shield interposed therebetween so as to form k independent and selectable string units.

10. A nonvolatile semiconductor storage device, comprising:
    a memory cell array that includes a plurality of nonvolatile memory cells connected in series in a vertical direction above a semiconductor substrate, and a plurality of word lines respectively connected to gates of the plurality of nonvolatile memory cells;
    a select gate transistor layer that is located above the memory cell array and includes first and second select gate transistors connected in series in the vertical direction and to the plurality of nonvolatile memory cells, and first and second select gate lines respectively connected to the first and second select gate transistors, wherein the first select gate transistor is above the second select gate transistor; and
    a control circuit that is configured to apply to a gate of the first select gate transistor a first voltage and to a gate of the second select gate transistor a second voltage higher than the voltage, when a sense amplifier detects a current flowing through the nonvolatile memory cells.

11. The nonvolatile semiconductor storage device according to claim 10, wherein
    the control circuit is further configured to apply to the gate of the first select gate transistor a third voltage and to the gate of the second select gate transistor a fourth voltage higher than the third voltage, when a write voltage is applied to a gate of one of the nonvolatile memory cells.

12. The nonvolatile semiconductor storage device according to claim 11, wherein
the plurality of nonvolatile memory cells are formed around a memory hole that extends vertically above the semiconductor substrate and the first and second select gate transistors are formed around a select gate transistor hole that extends vertically above the memory cell array, and
the memory hole and the select gate transistor hole are not aligned in the vertical direction.

13. The nonvolatile semiconductor storage device according to claim 12, wherein
a diameter of the memory hole is different from a diameter of the select gate transistor hole.

14. The nonvolatile semiconductor storage device according to claim 13, wherein the diameter of the memory hole is greater than the diameter of the select gate transistor hole.

15. The nonvolatile semiconductor storage device according to claim 14, wherein the select gate transistor layer is divided into k pieces in a horizontal direction with an insulating shield interposed therebetween so as to form k independent and selectable string units.

16. A method of performing a read operation on a nonvolatile semiconductor storage device comprising a memory cell array that includes a plurality of nonvolatile memory cells connected in series in a vertical direction above a semiconductor substrate, a plurality of word lines respectively connected to gates of the plurality of nonvolatile memory cells, and a select gate transistor layer that is located above the memory cell array and includes first and second select gate transistors connected in series in the vertical direction and to the plurality of nonvolatile memory cells, and first and second select gate lines respectively connected to the first and second select gate transistors, said method comprising:
executing a read operation on the nonvolatile memory cells, such that during a read period of the read operation, signals having different voltage levels are supplied to the first and second select gate lines.

17. The method according to claim 16, wherein
the first select gate transistor is above the second select gate transistor, and
during the read period of the read operation, the voltage level of the signal supplied to the first select gate transistor is lower than the voltage level of the signal supplied to the second select gate transistor.

18. The method according to claim 17, further comprising:
executing a write operation on the nonvolatile memory cells, such that during the write operation, independent signals are supplied to the first and second select gate lines.

19. The method according to claim 18, wherein the threshold voltage of the first and second select gate transistors differ.

20. The method according to claim 19, wherein the threshold voltage of the first select gate transistor is higher than the threshold voltage of the second select gate transistor.

* * * * *